(12) United States Patent
Guinn

(10) Patent No.: US 8,009,439 B2
(45) Date of Patent: Aug. 30, 2011

(54) METAL FOIL INTERCONNECTION OF ELECTRICAL DEVICES

(75) Inventor: Keith V. Guinn, Thousand Oaks, CA (US)

(73) Assignee: Raytheon Company, Waltham, MA (US)

( * ) Notice: Subject to any disclaimer, the term of this patent is extended or adjusted under 35 U.S.C. 154(b) by 136 days.

(21) Appl. No.: 11/998,670

(22) Filed: Nov. 30, 2007

(65) Prior Publication Data
US 2009/0140427 A1 Jun. 4, 2009

(51) Int. Cl.
*H05K 1/11* (2006.01)
(52) U.S. Cl. .................. 361/794; 361/799; 361/780
(58) Field of Classification Search ............ 361/794; 257/681; 174/255
See application file for complete search history.

(56) References Cited

U.S. PATENT DOCUMENTS

| | | | |
|---|---|---|---|
| 6,586,704 B1 | 7/2003 | Cockeram et al. | |
| 6,992,384 B2 * | 1/2006 | Joshi | 257/723 |
| 7,064,011 B2 | 6/2006 | Ikenaga et al. | |
| 2009/0052210 A1 * | 2/2009 | Ward et al. | 363/56.01 |
| 2009/0140414 A1 * | 6/2009 | Soyano et al. | 257/698 |
| 2009/0189264 A1 * | 7/2009 | Yato et al. | 257/676 |

OTHER PUBLICATIONS

Lai, Zonghe, et al., "Effect of the Microstructure of Ni/Au Metallization on Bondability of FR-4 Substrate", The Swedish Institute of Production Engineering research (IVF), S-431 53 Mölodal, Sweden. Lai, Zonghe, et al., http://extra.ivf.se/ngl/A-WireBonding/ChapterA.htm; Level 1, Level 2 and Level 4.

* cited by examiner

*Primary Examiner* — Yuriy Semenenko
(74) *Attorney, Agent, or Firm* — Iandiorio Teska & Coleman

(57) ABSTRACT

An electrical assembly (300, 400) includes a power IC such as a MOSFET (112, 412) attached to a substrate module (114, 214). The MOSFET includes a top surface comprising first and second conductive device surfaces (A, B), associated with first and second device ports, and a bottom surface comprising a third conductive device surface C associated with a third device port. A first foil element is bonded to the first conductive device surface(s) A and to each of the first conductive substrate surfaces (A1, A2) and provides a continuous conductive pathway from each conductive surface (A) to each other conductive surface (A) and to each conductive surface (A1, A2). A second foil element is bonded to the second conductive device surface(s) B and to the second conductive substrate surface B1 and provides a continuous conductive pathway from each device conductive surface (B) to the substrate conductive surface (B1). A third foil element may be installed to electrically interconnect the discrete second device surfaces (B). The foil elements reduce interconnection parasitics and reduce charge and thermal energy density at device conductive surfaces as compared to wire bonded electrical interconnections. The foil elements may be comprised of formed metal elements that are flexible but sufficiently rigid to hold a formed shape or flexible foils supported on a flexible dielectric substrate.

10 Claims, 7 Drawing Sheets

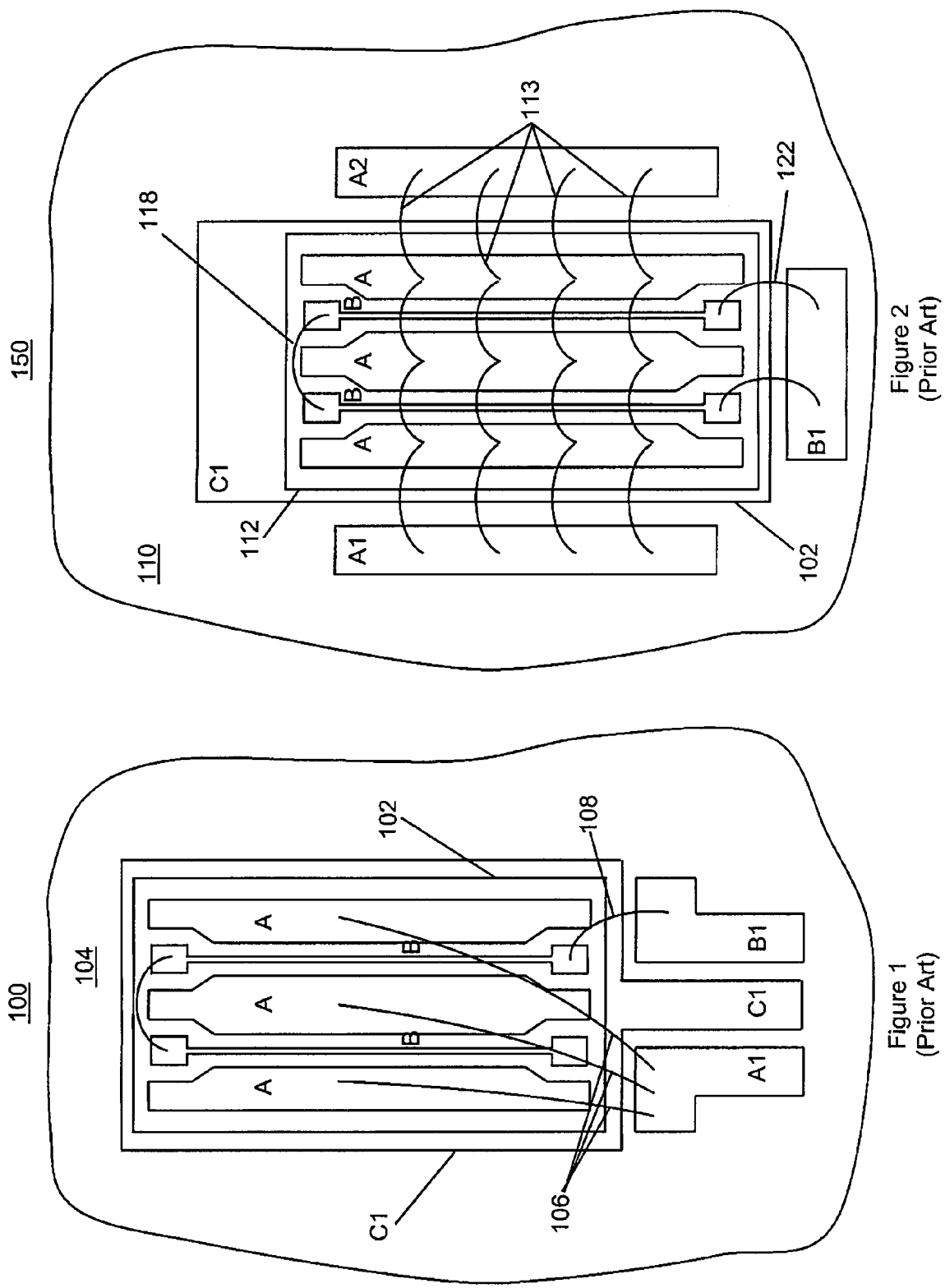

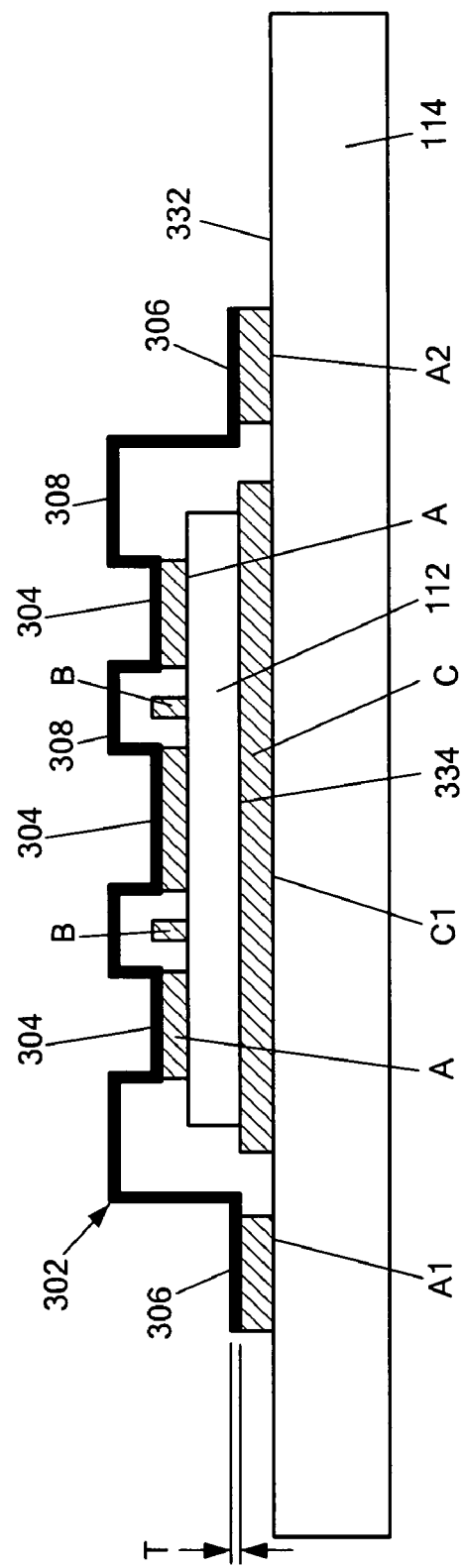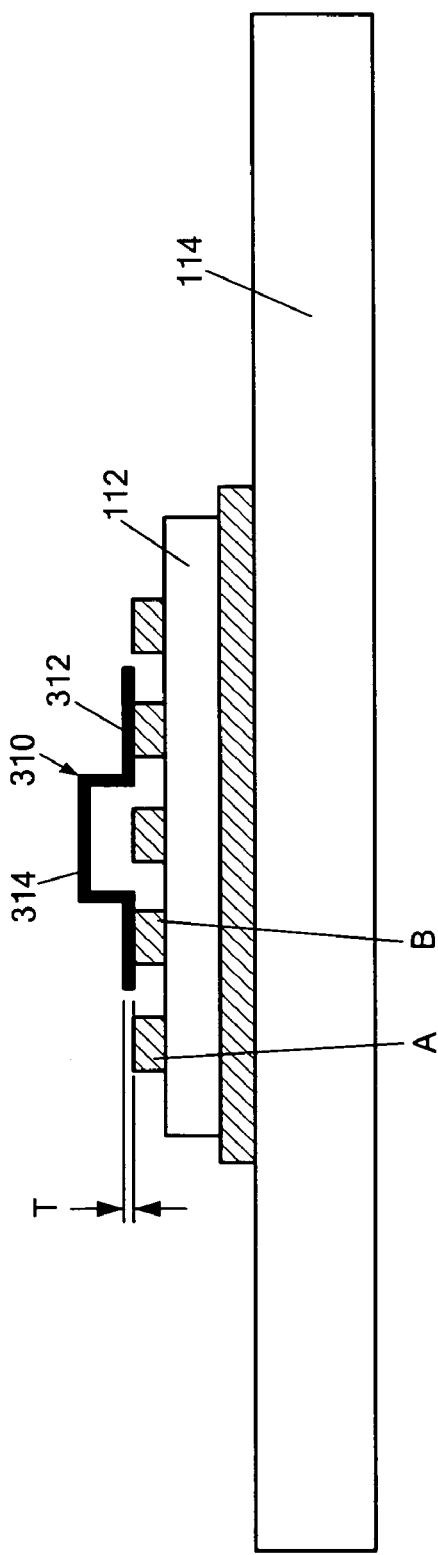
Figure 4
Figure 5

METAL FOIL INTERCONNECTION OF ELECTRICAL DEVICES

BACKGROUND OF THE INVENTION

1. Field of the Invention

The present invention relates to an improved method and apparatus for making electrical interconnects between power semiconductor devices and a substrate module and specifically to interconnecting power semiconductor devices with a substrate module using a formed conductive foil element or a formed flexible interconnection assembly comprised of a supporting dielectric film and conductive foil elements.

2. Description of the Related Art

Power semiconductor devices, or power integrated circuits (ICs), used as switches or rectifiers in power electronic circuits, and the like, often operate at considerably higher power and current density levels than other semiconductor devices.

Generally power ICs are enclosed or packaged in a housing formed with exposed conductive surfaces serving as IC input/output terminals or gates. Typically the packaged IC is positioned on a substrate module such as a lead frame or on a printed circuit board (PCB), and conductive surfaces of the IC are electrically interconnected with the substrate module or PCB. Generally, the substrate module or PCB provides an electrical interface between the IC and a larger electrical system.

The most common process for making electrical interconnections between ICs and a substrate module is by wire bonding. Automated wire bonding machines attach or mechanically bond a first end of a conductive wire to a conductive surface on the IC and attach or mechanically bond a second end of the wire to a corresponding conductive pad on the substrate module. The mechanical bonding occurs when the automated wire bonding machine contacts an end of a wire to a conductive pad and applies a pressure force in combination with applying thermal energy, ultrasonic energy or both. The applied pressure force and energy deforms the wire end and generates a mechanical bond between the wire end and the conductive pad. The mechanical bond may comprise a diffusion bond, chemical bond, adhesive bond or the like, depending upon the bonding process and equipment. Usually, the shape and surface area of the bond are controllable by the parameters of the automated wire bonding machine. After bonding a first end of the wire to the IC, a second end of the wire is mechanically bonded to an appropriate conductive pad on the substrate module forming a wire loop between the bonded ends. Generally, the size, shape and length of the wire loop are controllable by the parameters of the automated wire bonding machine to interconnect IC conductive pads with appropriate substrate module conductive pads. Generally, the diameter or cross-sectional area of wire, the size and shape of the wire bonds, and the loop characteristics are selected as may be required to achieve a desired electrical performance, reliability, and bonding process throughput time.

While most IC to substrate module interconnections are made using wire bonding, wire bonding power ICs is a special case that requires larger diameter high purity wires to handle the higher power, higher current densities and high switching frequencies of power ICs.

It is known to wire bond power ICs such as field effect transistors, (FET), insulated gate bipolar transistors (IGBT), thyristors, and power diodes to substrate modules. Typical wire bonded power IC interconnection use wire comprising high purity aluminum with diameters ranging of 0.101-0.508 mm, (0.004 to 0.020 inches) to make individual interconnections. These wires have 10 or more times the cross-sectional area of wires used to bond other ICs to a substrate module.

Typically power ICs have only two or three interconnecting terminals such as a source terminal, a drain terminal and a gate terminal. Often power ICs are comprised of multiple individual devices that work together to perform switching or other functions. The individual devices are carefully sized and spaced to equally distribute dissipated power. These individual devices are interconnected using large area terminals that spread current and heat among individual devices that form the IC. These terminals also are used as the wire bonding terminals. Still many power ICs are mounted directly to a heat sink to dissipate thermal energy generated during operation. Power ICs are often used as high frequency switches forcing rapid on-off current flow. Undesirable parasitics, such as, parasitic inductance and parasitic resistance, associated with wire bond interconnection, can induce large voltage and current spikes in the IC leading to poor IC reliability, IC failure and even explosive failure of the IC. To compensate for interconnection parasitics, it has been necessary to over-design power IC circuits with increased design margins and this has lead to reduce power efficiencies and increases in the cost, volume and weight of the ICs.

Another problem caused by the rapid on-off current flow over conventional interconnecting wire bonds is that the bond wires are susceptible to rapidly varying electro-thermal-mechanical stress which can lead to interconnection failures. In particular, rapid changes in current flow produce rapid heating and therefore rapid thermal expansion and contraction of the larger diameter relatively stiff wire material. These changes continuously vary the loop length thereby producing cycling stresses on wire bond contact points at each end of the loop. This action can lead to fatigue failure at the wire bond contact points which will lead to increased current and therefore stress on remaining bond connections, thereby reducing the reliability of the overall electrical system.

Accordingly, there is a need in the art to increase the reliability and improve the performance of electrical interconnections between power ICs and substrate modules.

SUMMARY OF THE INVENTION

The present invention overcomes the problems cited in the prior art by providing an improved electrical assembly (300) and assembly method.

It is an object of the present invention to provide an electrical interconnecting element suitable for interconnecting a power IC with a substrate module and interconnecting between power ICs with reduced inductance in the interconnecting elements.

It is an object of the present invention to provide an electrical interconnecting element suitable for interconnecting a power IC with a substrate module and interconnecting between power ICs with reduced resistance in the interconnecting elements.

It is an object of the present invention to provide an electrical interconnecting element suitable for interconnecting a power IC with a substrate module and interconnecting between power ICs with increased reliability of the interconnecting elements.

The electrical assembly (300) includes an electrical device (112) such as a power IC, e.g., a MOSFET, power transistor, power thyristors, power diode or the like supported on a substrate module (114). The electrical device (112) includes a plurality of conductive surfaces, leads or other electrical connecting elements forming electrical interconnections with the electrical device such as input output ports of the electrical device. The electrical device (112) includes first conductive device surface(s) (A) associated with a first input output port of the electrical device (112), second conductive device surface(s) (B) associated with a second input output port of the electrical device (112), and a third conductive device surface (C) associated with a third input output port of the electrical device (112). Often one conductive device surface (C) is located on the bottom surface of the device and is solder bonded directly to the appropriate substrate conductive surface (C1). The substrate device (114) includes three conductive surfaces, first substrate surfaces (A1, A2) corresponding with first conductive device surface(s) (A), a conductive second substrate surface (B1) corresponding with the second conductive device surface(s) (B), and a conductive third substrate surface (C1) corresponding with the conductive second device surface (C).

Interconnection between the input output ports (A and B) of the electrical device (112) and the associated substrate surfaces (A1, A2, and B1) is accomplished using conductive metal foil elements. A first formed conductive foil element (302) comprises a substantially uniform layer of conductive material such as aluminum, copper, or the like and has a thickness of about 0.05 mm (0.002 in.). The first formed conductive foil element (302) is formed with first contact surfaces (304) positioned to electrically interconnect with all of the first conductive first device surface (A) on the electrical device and further formed with second contact surfaces (306) positioned to electrically interconnect with first conductive substrate surfaces (A1 and A2) on the substrate module. In the case where the first device surface (A) is divided into a plurality of surfaces (A), the first formed conductive foil element (302) is formed to electrically interconnect each of the plurality of conductive first device surfaces A to each other and to each of the two conductive first substrate surface (A1, A2). The electrical assembly (300) includes one or more second formed conductive foil elements (316) for electrically interconnecting one or more conductive second device surfaces (B) with the second substrate surface (B1). The electrical assembly (300) may also include a third formed conductive foil element (310) for electrically interconnecting a plurality of discrete second conductive device surfaces (B) to each other. In each case where the first, second and third conductive foil elements are formed elements, the metal foil used to form the elements is flexible but is also sufficiently rigid to hold its formed shape until it is mechanically bonded in place. In particular, aluminum foils with a thickness of about 0.05 mm (0.002 in.) have the desired flexibility and are rigid enough to hold a formed shape.

A method for electrically interconnecting an electrical device (112, 412) to a substrate module (114, 214) includes solder bonding or otherwise attaching the bottom surface of the electrical device (112, 412) and specifically the third conductive device surface (C) to the third conductive substrate surface (C1). Further electrical interconnection of electrical device (112, 412) to the substrate module (114, 214) includes bonding or otherwise electrically interconnecting a first conductive foil element (302, 402) to each of a plurality of discrete conductive first device surfaces (A) positioned on the electrical device (112, 412) to electrically interconnect the discrete device surfaces (A) to each other. The method includes bonding or otherwise electrically interconnecting the first conductive foil element (302, 402) to one or two first conductive substrate surfaces (A1 and A2) positioned on the substrate module (114, 414). This electrically interconnects each of the discrete device surfaces (A) to one or two of the substrate module surfaces (A1 and A2). The first conductive foil element (302, 402) also can serve as an interconnect from substrate surface A1 to substrate surface A2, thus eliminating the need for such an interconnection on the substrate. This reduces the routing area required on the substrate, reduces current loop areas, and the associated parasitics.

The method further includes bonding or otherwise electrically interconnecting one or more second conductive foil elements (316, 416) to one or more second conductive device surfaces (B), positioned on the electrical device (112, 412). The second conductive foil elements are also bonding or otherwise electrically interconnected to a second conductive substrate surface (B1) positioned on the substrate module (114, 414). This electrically interconnects the second conductive device surface(s) (B) to the second substrate module surface(s) (B1).

In the case where the electrical device (112, 412) includes a plurality of discrete second conductive device surfaces (B), a third conductive foil element (310, 410) may be attached to each of the discrete second conductive device surfaces (B) to electrically interconnect each of the discrete second conductive device surfaces (B) with each other.

Although discrete foil pieces are described above for the electrical assembly (300), an alternate embodiment comprises multiple foil elements supported by a flexible interconnection assembly (450), thus allowing the use of a single piece comprised of multiple foil elements formed and shaped appropriately to be supported and positioned above the electrical device (412) and the substrate (214) to produce an interconnect structure. The combination of the supporting dielectric film with patterned metallization is commonly referred to as a flexible circuit. However, the features required in this alternate embodiment include a dielectric film approximately 0.0508 mm (0.002") thick made of a material such as polyimide or polyester film. Also, the metallization used to form the conductive or foil elements is typically a high conductive metal such as copper with suitable plating for bonding to devices or substrate surfaces. The surface used for bonding is required to be of suitable composition and thickness, such as 0.05 mm (0.002 inches thick) aluminum to allow proper bonding to the device and substrate surfaces.

Other metals can be placed where required to bond to other surfaces, e.g. gold plated to permit bonding to gold surfaces. It should be noted that in areas away from the bonding areas, thicker metal can be used to reduce interconnection parasitics. It is advantageous and efficient to be able to mass produce a single interconnection assembly that is comprised of a dielectric film and the required interconnection metal pieces. This single piece is easier to handle and bond in place as compared to freestanding individual pieces. The single interconnection piece can be formed to unique three dimensional shapes to follow the topology required to provide interconnection to devices and substrates that may be at different heights. Both the metal structures and the dielectric layers can be formed using mechanical methods such as thermoforming. Bonding the dielectric material prior to performing the metal to metal interconnection bonding may be useful to ensure the flexible foil assembly does not move during the metal bonding operations.

The single interconnection assembly (450) is comprised of a flexible dielectric sheet (415) that has been patterned with open area and supports a plurality of patterned interconnection elements. The interconnecting elements (402, 410, and 416) present on the single interconnection assembly (450) provide bonding areas that can be used to interconnect to substrate surfaces and device surfaces as well as provide leads off the substrate and device to allow the interconnection of outside signals. Interconnection of conducting elements such as connectors 420 and 422 or the like can be used to provide a low inductance Kelvin interconnection from off substrate. An example of the use of off module interconnection is the need to provide MOSFET or IGBT gate drive signals from off substrate. The single interconnection assembly method can be extended to provide low inductance interconnection between multiple power devices on a signal substrate and can also be used to provide multiple low inductance interconnections off module.

Application of the flexible interconnection assembly is presented in FIG. 9. The electrical assembly (400) includes an electrical device (412) such as a power IC, e.g., a MOSFET, power transistor, power thyristors, power diode or the like supported on a substrate module (214). The electrical device (412) includes a plurality of conductive surfaces, leads or other electrical connecting elements forming electrical interconnections with the electrical device such as input output ports of the electrical device. The electrical device (412) includes first conductive device surface(s) (A) associated with a first input output port of the electrical device (412), second conductive device surface (B) associated with a second input output port of the electrical device (412), and a third conductive device surface (C) associated with a third input output port of the electrical device (412). Often one conductive device surface (C) is located on the bottom surface of the device and is often bonded directly to the appropriate substrate conductive surface. The substrate device (214) includes three conductive surfaces, first conductive substrate surfaces (A1, A2) corresponding with the first conductive device surface(s) (A), a conductive second substrate surface (B1) corresponding with the second conductive surfaces (B), and a third conductive substrate surface (C1) corresponding with the third conductive device surface (C).

Interconnection between the input output port(s) (A) of the electrical device (412) and the associated substrate surfaces (A1 and A2) is accomplished using a substantially flexible conductive metal foil element (402) which is supported by and integral with a flexible dielectric layer (415). The first conductive foil element (402) comprises a substantially uniform layer of conductive material such as aluminum, copper, or the like having a thickness of about 0.05 mm (0.002 in.). The first conductive foil element (402) is formed with a first contact surfaces (404) positioned to electrically interconnect with the conductive first device surface(s) (A) on the electrical device and with second contact surfaces (406) positioned to electrically interconnect with the first conductive substrate surfaces (A1 and A2) on the substrate module. In the case where the first device surface (A) is divided into a plurality of surfaces (A), the first conductive foil element (402) is formed to electrically interconnect each of the plurality of conductive first device surfaces A to each other and to each of the two conductive first substrate surface (A1, A2). The electrical assembly (400) includes one or more second conductive foil element (416) for electrically interconnecting one or more second conductive device surfaces (B) and with a conductive a second conductive substrate surface B1 or with a trace or connector 422 that allows off module interconnection. The electrical assembly (400) may also include a third conductive foil element (410) for electrically interconnecting a plurality of discrete second conductive device surfaces (B) to each other.

A method for electrically interconnecting an electrical device (412) to a substrate module (214) includes attaching the bottom surface of the electrical device (412) to the substrate conductive surface (C1). Further electrical interconnection of electrical device (412) to the substrate module (214) includes bonding or otherwise electrically interconnecting the first conductive foil element (402) to each of a plurality of discrete first conductive device surfaces (A) positioned on the electrical device (412). This electrically interconnects the discrete device surfaces (A) to each other. The method includes bonding or otherwise electrically interconnecting the first conductive foil element (402) to one or two conductive first substrate surfaces (A1 and A2) positioned on the substrate module (214). This electrically interconnects each of the discrete device surfaces (A) to the substrate module surfaces (A1 and or A2). The first conductive foil element (402) also can serve as an interconnect from substrate surface A1 to substrate surface A2, thus eliminating the need for such an interconnection on the substrate. This reduces the routing area required on the substrate, reduces current loop areas, and the associated parasitics. Foil element (402) also serves to provide off module interconnection.

Further electrical interconnection of electrical device (412) to the substrate module (214) includes bonding or otherwise electrically interconnecting the second conductive foil element (416) to each of a plurality of discrete second conductive device surfaces (B) positioned on the electrical device (412). The method includes bonding or otherwise electrically interconnecting the second conductive foil element (416) to one or more second conductive substrate surfaces (B1) positioned on the substrate module (214).

In the case where the electrical device (412) includes a plurality of discrete second conductive device surfaces (B), a third conductive foil element (410) may be attached to each of the discrete second conductive device surfaces (B) to electrically interconnect each of the discrete conductive second device surfaces (B) with each other.

BRIEF DESCRIPTION OF THE DRAWINGS

The features of the present invention will best be understood from a detailed description of the invention and a preferred embodiment thereof selected for the purposes of illustration and shown in the accompanying drawings in which:

FIG. 1 illustrates a top view of a conventional electrical assembly utilizing a single wire to interconnect each device terminal pad with a corresponding substrate module terminal pad, and a bottom terminal of a device is solder bonded to a leadframe.

FIG. 2 illustrates a top view of an electrical assembly utilizing multiple wires to interconnect each device terminal pad with a corresponding substrate module terminal pad, and a bottom terminal of an electrical device is solder bonded to a leadframe.

FIG. 4 illustrates a section view taken through a first formed conductive foil element of the electrical assembly in FIG. 3 along lines D-D.

FIG. 5 illustrates a section view taken through a third formed conductive foil element of the electrical assembly in FIG. 3 along lines E-E.

DESCRIPTION OF THE PREFERRED EMBODIMENT

Figure 3:
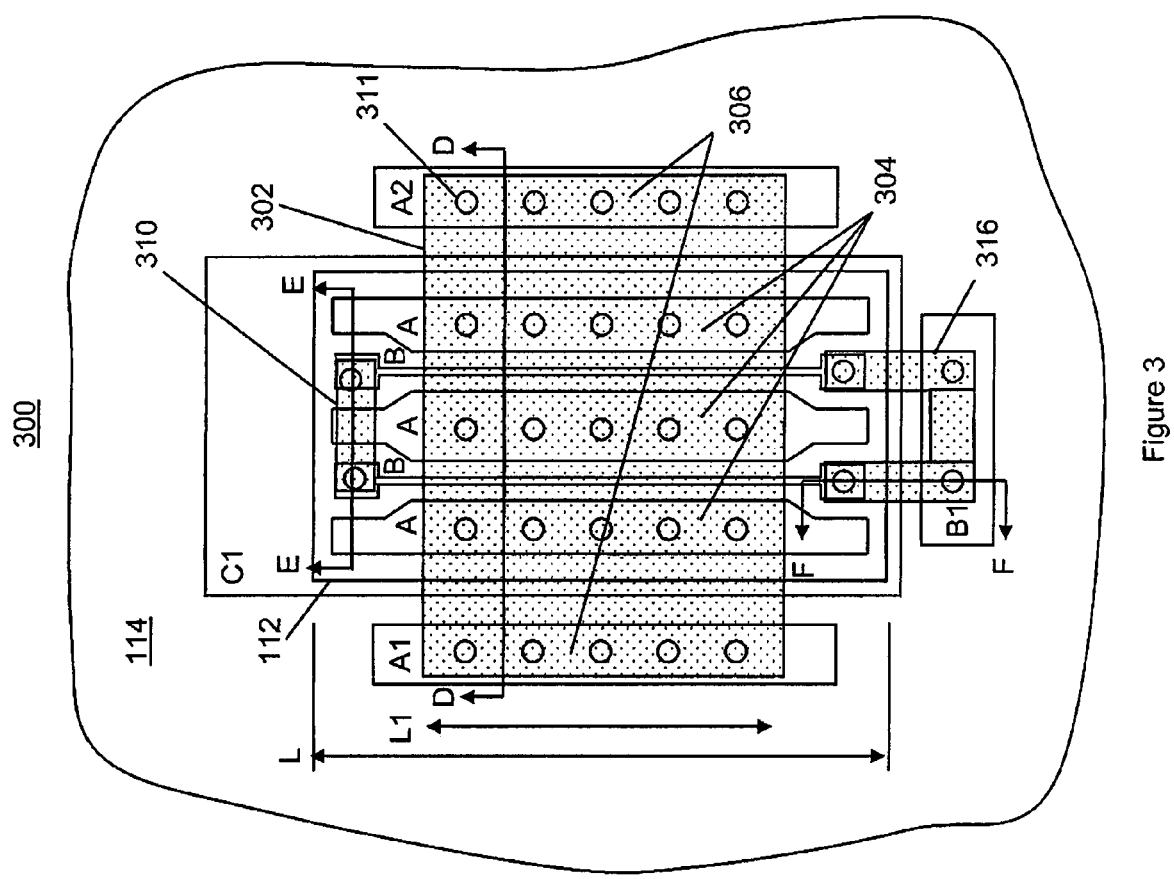
FIG. 3 illustrates a top view of an electrical assembly utilizing formed conductive foil elements to interconnect each device terminal pad with a corresponding substrate pad including a bottom terminal of an electrical device being solder bonded to a substrate pad according to the present invention.

Referring to FIG. 1 a schematic representation of a first embodiment 100 of a conventional unpackaged electronic device 102 e.g. an integrated circuit (IC) or chip, supported on a substrate module 104 is shown in top view. An outer package or housing, not shown, supports and protects the electronic device 102 and substrate module 104 against moisture and contaminates as well as provides an electromagnetic shield.

The electronic device 102 includes a plurality of conductive device surfaces A and B, disposed on a top surface of the device 102 and a conductive device surface C, not shown, on the bottom surface of the device 102. Alternately, or additionally, other conductive device surfaces may be disposed on other surfaces of the packaged electronic device 102. Each conductive device surface A, B, and C comprises a conductive metal, e.g. aluminum, or a conductive bondable material, or the like suitable for collecting surface charges thereon and or conducting current therethrough. Each conductive device surface A, B, and C is electrically interconnected with elements of the IC and comprises an input/output interface with the IC, such as a signal gate, power port or ground plane. Each conductive device surface A, B and C has a surface area over which electrical charge may be substantially uniformly distributed. In the example of FIG. 1, the electrical device 102 includes three first device surfaces designated A, and two second device surfaces designated B disposed on its top surface. The electrical device 102 also includes a third device surface designated C disposed on its bottom surface. Each conductive first device surface A is electrically interconnected with the same first input/output terminal of the electrical device 102 and each conductive second device surface B is electrically interconnected with the same second input/output terminal of the electrical device 102. Similarly, the third device surface C is electrically interconnected with a third input/output terminal of the electrical device 102.

A substrate module 104 may comprise a printed circuit board, (PCB), a die and frame, or any other element configured to provide electrical interconnects between the packaged electronic device 102 and a larger electrical system, not shown, electrically interconnected with the substrate module. The substrate module 104 includes a plurality of conductive substrate surfaces A1, B1, and C1, disposed on a top surface of the substrate module 104. Alternately, or additionally, other conductive substrate surfaces may be disposed on other surfaces of the substrate module 104. Each conductive substrate surface A1, B1, or C1 is comprised of a conductive metal, e.g. copper plated with aluminum or nickel for wire bonding or metal layers suitable for either wire or solder bonding, or the like, suitable for collecting surface charges thereon and for conducting current therethrough. Each conductive substrate surface A1, B1 and C1 is electrically interconnected with elements of the larger electrical circuit and comprises an input/output interface with the larger electrical circuit, such as a gate terminal or power port. Each conductive substrate surface A1, B1, and C1 has a surface area over which electrical charge may be substantially uniformly distributed or current may be substantially uniformly conducted. In the example of FIG. 1, the substrate module 104 includes a conductive first substrate surface designated A1, a conductive second substrate surface designated B1, and a conductive third substrate surface designated C1.

In the particular case wherein the electrical device 102 comprises a power IC such as a power transistor, power thysistor or power diode, the conductive first device surfaces A may comprise a source terminal and the conductive second device surfaces B may comprise a gate terminal, and the conductive device surface C may comprise a drain terminal. In one example of an electrical interconnecting configuration used in the prior art, the power IC comprises field effect transistor, (FET), such as a metal-oxide-semiconductor field-effect transistor (MOSFET) with each conductive first device surface A interconnected with the conductive first substrate surface A1 by a single wire or ribbon element 106 and with each conductive second device surface B interconnected with the conductive second substrate surface B1 by a single wire or ribbon element 108. The bottom surface (C) of the FET is solder bonded to the conductive third substrate surface C1. The wire or ribbon 106 comprises high purity aluminum having a diameter of approximately 0.101-0.508 mm, (0.004-0.20 inches) or with a cross-sectional areas of approximately 0.008-0.202 mm$^2$, (12.6-0314.2 mil$^2$). While this configuration is easily achieved using conventional automated wire bonding equipment and further provides an economic way to interconnect the MOSFET 102 with the substrate module 104, the configuration shown in FIG. 1 is not acceptable in some applications. In particular, the three wires or ribbons 106 present inductive and resistive parasitics that prevent proper operation at higher switching frequencies and also present reliability issues due to electro-thermal-mechanical stresses during startup and switching.

Referring now to FIG. 2, a second prior art embodiment 150 includes the same electrical device, MOSFET 102, shown in top view and mounted to a modified substrate module 110. The MOSFET 102 includes three conductive first device surfaces A, two conductive second device surfaces B and one conductive device surface C, not shown. The substrate module 110 includes two conductive first substrate surfaces A1 and A2 for interconnecting with the first device surfaces A, one conductive second substrate surface B1, for interconnecting with the second device surfaces B and one conductive third substrate surface C1 for interconnecting with the third device surface C by a solder bond.

In the configuration 150, of FIG. 2, a plurality of wires or ribbons, 113, are used to interconnect each of the conductive first device surfaces A with each of the other conductive first device surfaces A as well as with the substrate conductive surfaces A1 and A2. The multiple wires or ribbons 113 allow current to readily flow between the conductive first device surfaces A thereby more uniformly distributing surface charges over each of the first device surfaces A during operation. Localized heating on the conductive first surfaces A is reduced as the number of wires or ribbons used is increased. Current distribution and susceptibility to electro-thermo-mechanical stress is reduced as the level of switching current per wire is reduced. In FIG. 2, wires or ribbons, 113, are shown in a stitch configuration. Other configurations that use non-stitched wire segments can be used to produce similar interconnection arrangements.

In the configuration 150, the plurality of wires or ribbons, 113, comprises high purity aluminum having a diameter of approximately 0.101-0.508 mm, (0.004-0.020 inches) or a cross-sectional area of approximately 0.008-0.202 mm$^2$, (12.6-0314.2 mil$^2$). The spacing between the wires is substantially uniform such that the wires are substantially evenly distributed over the device surfaces A and the substrate surfaces A1 and A2. Minimum spacing is determined primarily by bonding tool dimensions and bonding equipment tolerance guidelines.

As shown in FIG. 2, the substrate module 110 has two conductive first substrate surfaces A1 and A2 for exchanging signals between the MOSFET 112 and the larger electrical circuit interconnected therewith. Moreover the configuration 150 provides four rows of four wires or ribbons 113 each connected between the conductive first device surface A and the conductive first substrate surfaces A1 and A2. Accordingly, the embodiment 150 provides eight electrical interconnections between the conductive first device surface A and the larger electrical circuit associated with the substrate module 110 while the embodiment 100 provides only 4 electrical interconnections between the conductive first device surface A and the larger electrical circuit associated with the substrate module 104. Moreover the embodiment 150 allows current to flow un-pinched and efficiently as multiple paths are available from a given conductive surface A in 150 where only one path is possible in embodiment 110. Calculations made by applicant show that the embodiment 150 had less inductance between the conductive first device surfaces A and reduced localized heating of the conductive first device surfaces A. In particular, in the embodiment 100 estimated device to substrate module inductance between the first surfaces A and A1 was 4 nH, while in the embodiment 150, estimated device to substrate module inductance between the first surfaces A and A1 and A and A2 was 2 nH.

In the embodiment 150, each of the two second device conductive surfaces B are electrically interconnected by wires or ribbons 118. The wires or ribbons 118 provide a path for current flow between the conductive second device surfaces B to more uniformly distribute surface charges thereon and to prevent localized heating. In addition, each of the three conductive second device surfaces B is electrically interconnected with the conductive second substrate surface B1 by a wire or ribbon 122. Each of the wires or ribbons, 118, 122 comprises high purity aluminum having a diameter of approximately 0.101-0.508 mm, (0.004-0.020 inches) or a cross-sectional area of approximately 0.008-0.202 mm$^2$, (12.6-0314.2 mil$^2$) Accordingly, the embodiment 150 provides electrical interconnections between the device second surfaces B that were not provided in the embodiment 100. This improves current distribution over the second device surfaces B and reduces localized heating.

Referring now to FIG. 3 an improved electrical assembly 300 according to the present invention includes an unpackaged MOSFET 112 mounted onto a substrate module 114. The MOSFET 112 includes three conductive first device surfaces A extending along a longitudinal length L of the MOSFET 112. The MOSFET 112 further includes two conductive second device surfaces B extending along the longitudinal length L and positioned between opposing pairs of conductive first device surfaces A. The MOSFET 112 further includes a conductive surface C on a bottom side thereof and the surface C may comprise the entire bottom surface. The substrate module 114 includes two conductive first substrate surfaces A1 and A2 each leading to the same first input/output port of a larger electrical circuit associated with the substrate module 114. The substrate module 114 includes one conductive second substrate surface B1 leading to a second input/output port of a larger electrical circuit associated with the substrate module 114. The substrate module 114 includes one conductive third substrate surface C1 for receiving the MOSFET 112 thereon and for solder bonding the surface C thereto.

Referring to FIGS. 3 and 4, according to one aspect of the present invention, each of the three conductive first device surfaces A is electrically interconnected to each other by a first formed conductive foil element 302. The first formed conductive foil element 302 comprises a substantially uniformly thick unitary layer of conductive material such as aluminum, copper, or the like, formed to provide a substantially continuous conductive path through the material volume. The first formed conductive foil element 302 is formed to provide three first contact surfaces 304 positioned and sized to contact each of the three first device surfaces A along a length L1. Preferably the length L1 is 80% or more or the length L, but lengths L1 of 50% of L provide improved performance over wire bonded electrical interconnections. More generally, the first formed conductive foil element 302 includes a first contact surface 304 for each first device surface A, including the case where the electrical device 112 has only one first device contact surface A. As best viewed in FIG. 4, each of the first contact surfaces 304 is substantially parallel and substantially co-planar; however, in some applications, some of the first contacting surfaces 304 may be positioned in other planes in order to make electrical contact with first device contact surfaces A that may be in another orientation or position.

The first formed conductive foil element 302 is also formed to provide two second contact surfaces 306 positioned to contact each of the two first substrate surfaces A1 and A2. More generally, the first formed conductive foil element 302 includes one second contact surface 306 for contacting each first substrate surface A1 or A2, including the cases where the substrate module 110 has only one first substrate surface A1, or more than two first substrate surfaces. As best viewed in FIG. 4, the second contact surfaces 306 are substantially parallel and co-planar with each other and are substantially parallel with but not co-planar with the first contact surfaces 304. However in some applications, the first and second contacting surfaces 304 and 306 may be parallel and coplanar.

Preferably, the first formed conductive foil element 302 is formed with a length L1 that is as long as is practical for contacting each of the first device surfaces A over the entire length L in order to maximize the electrical contact area between the first device surfaces A and the first contact surfaces 304. Similarly, it is desirable that the first substrate surfaces A1 and A2 as well as the second contacting surfaces 306 have a longitudinal length approaching the device length L in order to maximize the electrical contact area between the first substrate surfaces A1, A2 and the second contact surfaces 306. While lengths of L1 equal to less than half of the length L may be usable with some improvement over the embodiment 150, it is desirable that the first contacting surface 304 is configured to contact 50% or more of the total surface area of all the first device surfaces A and that the second contacting surface 306 is configured to contact 50% or more of the total surface area of all the first substrate surfaces A1, A2.

While the first formed conductive foil element 302 is configured to make electrical contact with each of the first device surfaces A, the first foil element 302 is formed to avoid electrical contact with any of the second device surfaces B. Specifically, the first formed conductive foil element 302 includes a plurality of longitudinal ridges 308 formed coincident with the location of each conductive second device surface B. Each longitudinal ridge 308 comprises a raised feature wherein the material volume is bent or otherwise formed to avoid making electrical contact between a surface of the first conductive foil element 302 and a conductive second device surface B while still providing a continuous conductive path over the conductive second device surface B through the material volume. In the example embodiment shown in section D-D of FIG. 4, each longitudinal ridge 308 has a substantially square cross-section and the ridge extends along the first foil element length L1. However, any other ridge cross-section can be used including a semicircular, rectangular, or triangular cross-section. Moreover, the longitudinal ridges 308 may also be filled with an electrically insulating material such as a room temperature vulcanizing (RTV) polymer insulator or the like to further ensure that the foil element 302 is electrically isolated from the second device terminals B. More generally, the first foil element may include any raised feature 308 that prevents the first foil element from making electrical contact with any conductive device surface that is not the device surface A while also providing a continuous conductive path passing over the conductive device surface that is not the device surface A.

Figure 8:
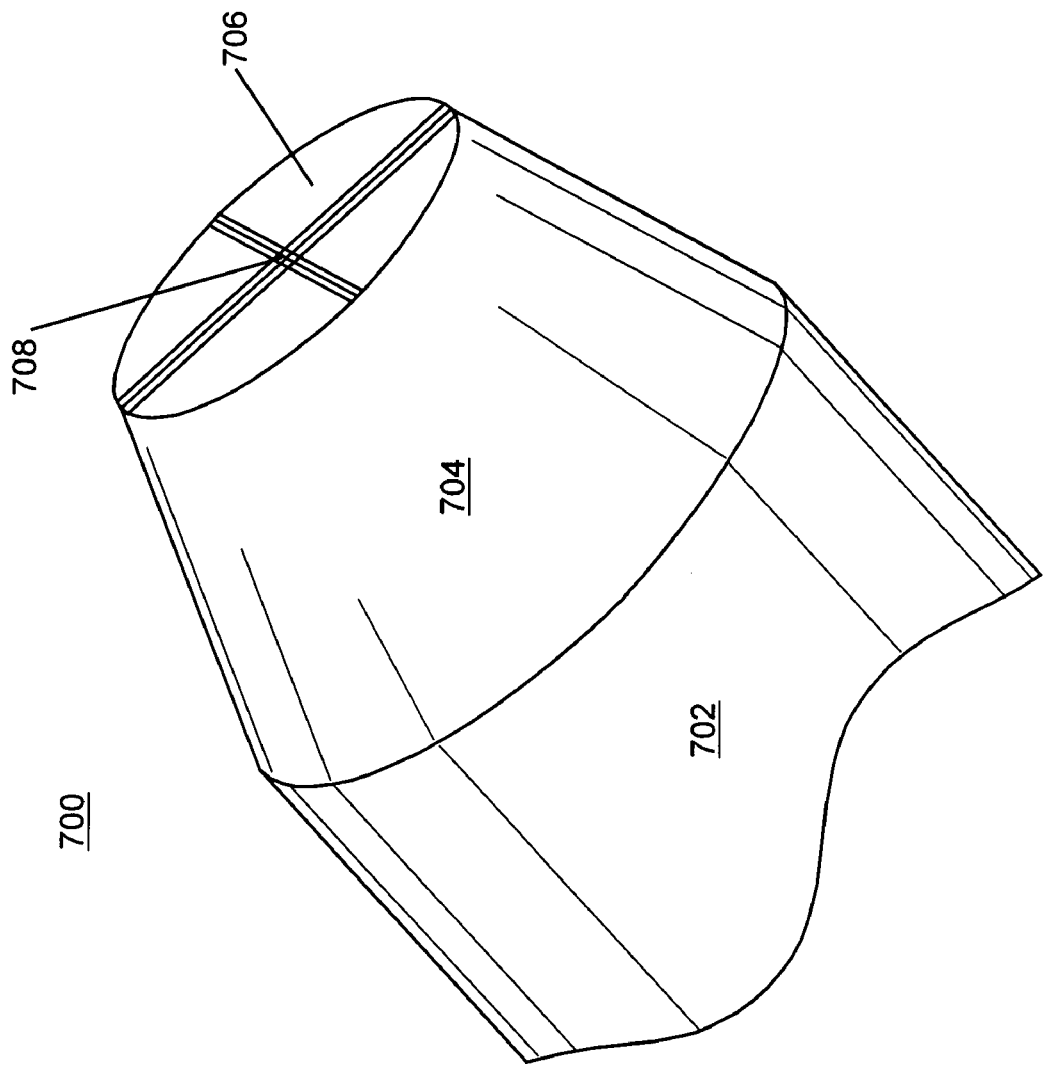
FIG. 8 illustrates an isometric view of a mechanical bonding tool according to the present invention.

The first formed conductive foil element 302 is mechanically bonded to each of the first device surfaces A at one or more bond points 311 and to each of the first substrate surfaces A1 and A2 at one or more bond points 311. Generally each bond point 311 is formed by a bonding tool 700, shown in FIG. 8. The bonding tool 700 generally comprises a rod 702, having a cone-shaped head 704, narrowed down to a bond area 706. The bond area 706 may be circular, rectangular or other cross-sections. The bond area 706 includes a cross 708 or other feature protruding upward from the bond area 706.

Generally the bond area 706 is pressed against the foil element 302 on a surface that is opposed to an electrical contacting surface 304 or 306 and force is applied along a longitudinal axis of the bonding tool 700 to force the foil element 302 into mechanical contact with a surface to which is will be bonded, e.g. a first device surface A or first substrate surface A1, A2. The bonding tool 700 is then heated or vibrated at an ultrasonic frequency, or both, until the pressure provided by the longitudinal force, the heat and the ultrasonic vibration cause the foil element 302 and the conductive surface that the first foil element 302 is in contact with to become mechanically bonded. Accordingly, the foil element 302 is bonded at bond points 311 to electrical device and substrate module conductive surfaces, e.g. A, A1, A2, B, and B1 as required. The mechanical bond may comprise a chemical bond, diffusion bond, adhesive bond or any other mechanical bond that allows electrical current to readily flow across the bond area and mechanically secures the foil element 302 to a desired conductive surface. In a preferred embodiment, the bond area 706 is circular in cross-section with a diameter of approximately 0.64 mm, (0.025 in.). The bonding tool 700 is based on a TAB (tape automated bonding) tool design that is in widespread use in the packaging industry. The features of the bonding tool 700, such as diameter and protruding cross height, were adjusted for the present foil bonding task.

Referring to FIGS. 3 and 5, according to a further aspect of the present invention, a second formed conductive foil element 310 is provided to electrically interconnect each of the conductive second device second surfaces B to each other. The second formed conductive foil element 310 comprises a substantially uniformly thick layer of conductive material such as copper, aluminum, or the like, formed with multiple first contact surfaces 312 positioned to contact each of the second device surfaces B. More generally, the second conductive foil element 310 includes first contacting surfaces 312 for each conductive second device surface B. Each of the first contacting surfaces 312 is mechanically bonded to a second device surface B at the bond points 311 by the bonding tool and method described above.

While the second conductive foil element 310 is configured to make electrical contact with each of the second device surfaces B, the second foil element 310 includes a raised ridge or feature 314 that prevents the second foil element from making electrical contact with any conductive device surface that is not the device surface B while also providing a continuous conductive path passing over the conductive device surface that is not the device surface B. Specifically, the second conductive foil element 310 includes a longitudinal ridge 314 formed coincident with the location of each conductive first device surface A to prevent the second foil element 310 from contacting a first device surface A. As shown in the section E-E of FIG. 5, the longitudinal ridge 314 has a substantially square cross-section. However, any other cross-section can be used including a semicircular, rectangular, or triangular cross-section. Moreover, the longitudinal ridges 314 may also be filled with an electrically insulating material such as a room temperature vulcanizing (RTV) polymer insulator or the like to further ensure that the second foil element 310 is electrically isolated from the first device terminals A.

In an alternate embodiment of the second foil element 310, some IC devices may comprise conductive second device surfaces B that are sufficiently raised above the conductive first device surfaces A that the second foil element 310 may comprises a flat bar spanned across each of the second device surfaces B without making electrical contact with first device surfaces A. In this case the flat bar has a uniform thickness T and a rectangular cross-section with a longitudinal length that is long enough to span all of the conductive second device surfaces B that need to be interconnected.

In each embodiment of the second foil element, the second foil element 310 has a lateral width that is wider than the bond area and preferably wide enough to provide sufficient current flow through the second foil element 310 for allowing the electrical potential of the interconnected conductive second surfaces B to come to equilibrium.

Figure 6:
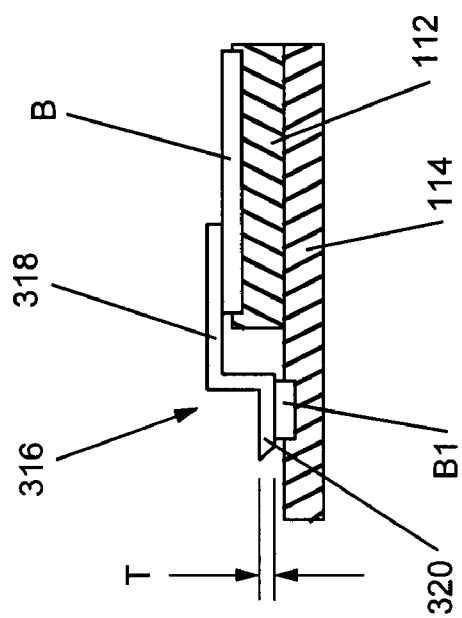
FIG. 6 illustrates a section view taken through a second formed conductive foil element of the electrical assembly in FIG. 3 along lines F-F.

Referring now to FIGS. 3 and 6, according to a further aspect of the present invention, two third formed conductive foil elements 316 are positioned to electrically interconnect each of the conductive second device surfaces B with the conductive second substrate surface B1. Generally each third conductive foil element 316 comprises a substantially uniformly thick layer of conductive material such as copper, aluminum, or the like, formed to contact a second device surface B at a first tab 318 and to contact a second substrate surface B1 at a second tab 320. As shown in FIG. 6, the first and second tabs 318, 320 are substantially parallel but not coplanar and are positioned as required to make electrical contact with the desired surfaces B and B1. Each of the third conductive foil elements 316 is mechanically bonded to the MOSFET 112 at bond points 311 and to the substrate module 114 at bond points 311.

Figure 7:
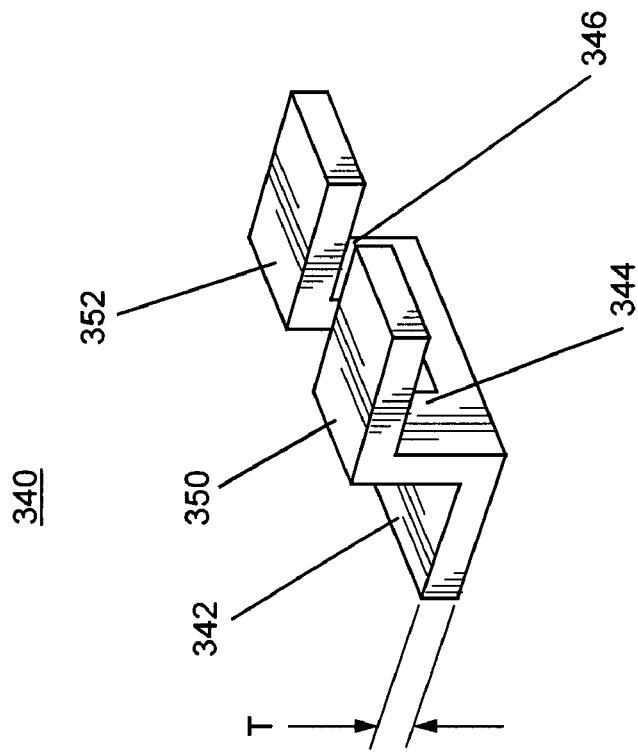
FIG. 7 illustrates an isometric view of an alternate embodiment of a third formed conductive foil element according to the present invention.

Referring to FIG. 7, according to a further aspect of the present invention, an alternate embodiment of a third formed conductive foil element is shown in isometric view as element 340. The third formed conductive foil element 340 comprises a substantially uniformly thick unitary layer of conductive material such as copper, aluminum, or the like, formed to provide a substantially continuous conductive path through the material volume. The third conductive foil element 340 includes a continuous lower tab 342 extending along its transverse width for contacting the second substrate surface B1. The third formed conductive foil element 340 includes two segregated tab elements 344 and 346 extending vertically up from the lower tab 342 and each including a longitudinal portion 350 and 352 extending from the tab elements 344 and 346. The longitudinal portions 350 and 352 are provided to contact each of the device second terminals B shown in FIG. 3. The third formed conductive foil element 340 is mechanically bonded to a second device surfaces B at two bond locations 311 and to the second substrate surface B1 at two bond locations 311 by the bonding method and apparatus described above.

Referring to FIG. 3 and FIG. 4, the substrate module 114 includes a top surface 332 which includes exposed conductive substrate surfaces formed thereon, such as A1, A2, B1 and C1. The MOSFET 112 includes a bottom surface 334 which includes the conductive device contact surface C and which contacts the substrate module top surface 332 at the conductive substrate surface C1 and is held thereon by suitable means, e.g. solder bonding. In a further aspect of the electrical interconnection between the MOSFET 112 and the substrate module 114, the device contact surface C may comprise a source terminal, a drain terminal, a gate terminal, a ground plane or any other terminal connection.

Each of the formed conductive foil elements described above, 302, 310, 316 and 340 has a surface area and a thickness T defining an element volume. In a preferred embodiment, each of the formed foil elements 302, 310, 316 and 340 comprises high purity aluminum or copper having a thickness T ranging from 0.05-0.25 mm (0.002-0.010 inches). However thicker material layers are usable. Generally the material selected should have a thickness consistent with providing an element that is easily formed by stamping or another die forming method, that is sufficiently rigid to hold its shape until it is mechanically bonded in place, and that can be easily bonded by the bonding methods described above. The preferred thickness may be reduced in the bonding areas 311 to optimize the bonding process and thicker in the areas away from the bonding areas to afford larger cross section area and therefore reduced current density. In order to increase the reliability of the foil interconnection over that of large diameter wire interconnection, it is important that the foil element shape and structure have reduced stiffness and increased flexibility between bond points. Using thin foils with raised features 308 and 314 reduces the potential for electro-thermal mechanical induced stresses which may lead to failure.

According to the invention, substantially all of the formed foil element volume provides a conductive path through which electrical charges are conducted. Generally in each example of the present invention, the material volume of conductive foil element interconnecting the electrical device 102 exceeds the material volume of wire or ribbon conductive elements of the prior art configurations 100 and 150 shown in FIGS. 1 and 2. Accordingly, the first, second and third formed conductive foil elements 302, 310, 316 and 340 of the present invention provide less resistance in the conductive pathways formed between the electrical device 102 and the substrate module 114. Accordingly the current density in each individual conductive pathway is reduced, thereby reducing thermal heating in the MOSFET 112 device and in the conductive pathways provided by the foil elements 302, 310, 316 and 340. This reduction in thermal heating improves the reliability of the electrical interconnections by reducing thermally induced stresses in the bond areas.

In addition, the first formed conductive foil element 302 is bonded to the conductive first device surfaces A at a large number of bond locations 311, e.g. more than 10. Similarly the first formed conductive foil element 302 is bonded to the conductive first substrate surfaces A and A1 at a large number of bond locations 311, e.g. 10 or more. Generally the present invention provides an increased number of bond locations and the increased surface area of each bond location and these features improve the reliability of the interconnection between the electrical device 112 and the substrate module 114 by reducing thermal heating and current density at bond locations and by providing more bond locations which allows the electrical assembly 300 to continue to operate reliably even if a portion of the bond locations become inoperable.

Finally, the present invention reduces parasitics between the MOSFET 112 and the substrate module 114 by reducing inductance in the electrical interconnections between the device surfaces A and substrate surfaces A1 and A2. In particular, applicant has shown that the first foil element 302 reduces the interconnection inductance by a factor of four as compared with the prior art embodiment 150 shown in FIG. 2.

Figure 9:
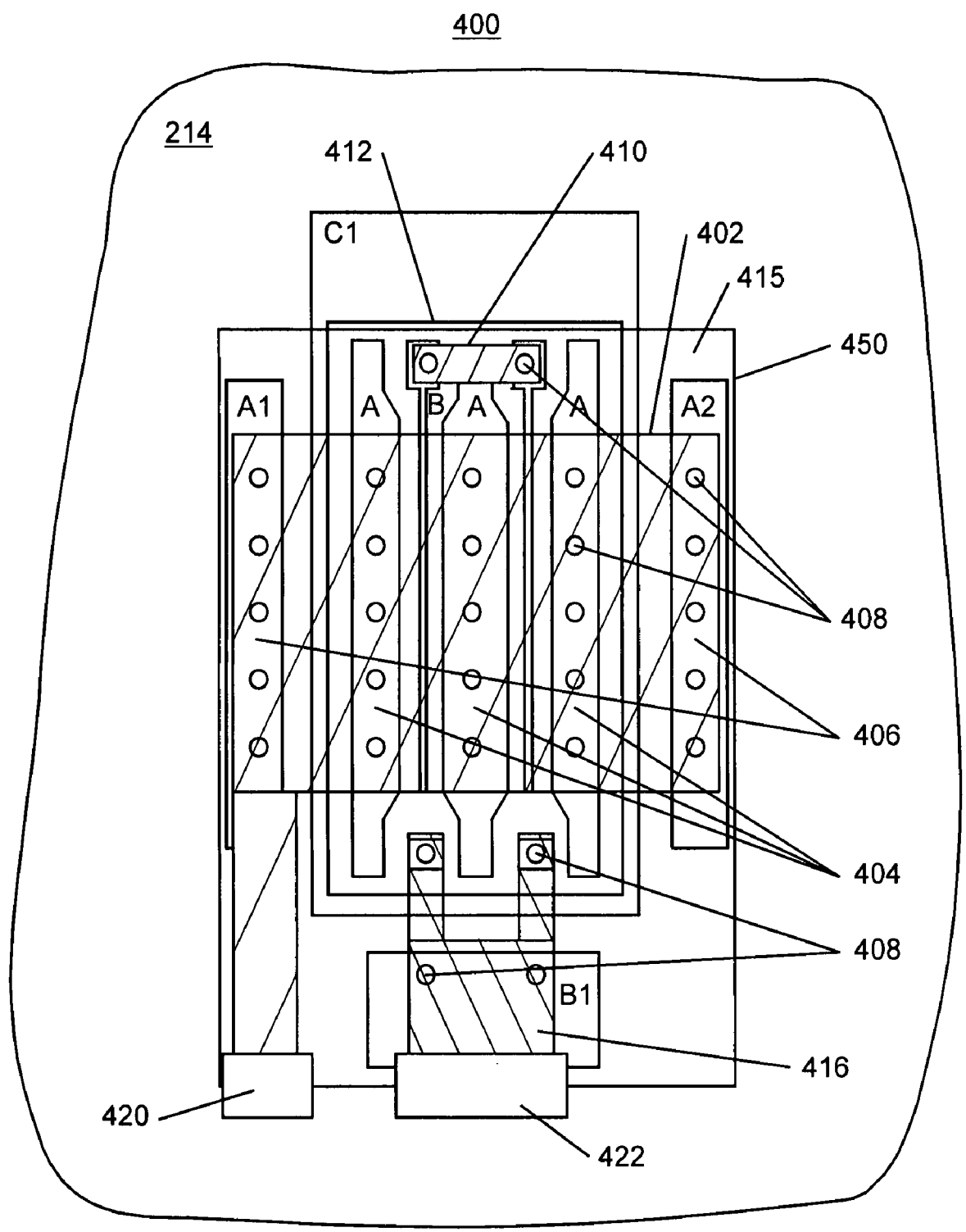
FIG. 9 illustrates a top view of an electrical assembly utilizing a flexible interconnect assembly to interconnect each device terminal pad with a corresponding pad of a substrate according to the present invention.

Referring now to FIG. 9 an improved electrical assembly 400 according to an alternate embodiment of the present invention includes an unpackaged electrical device 412, e.g. an IC, mounted onto a substrate module 214. The device 412 includes conductive device surfaces A and B on a top surface thereof and C on a bottom surface thereof. The substrate module 214 includes conductive substrate surfaces A1, A2, B1 and C1. According to an alternate embodiment of the present invention, the improved electrical assembly 400 includes a substantially flexible unitary electrical interconnecting element 450 configured to electrically interconnect each of the conductive device surfaces A with the substrate module surfaces A1 and A2 as well as to electrically interconnect each of the device surfaces B with substrate module surfaces B1. In particular, the flexible unitary electrical interconnecting element 450 comprises a flexible dielectric layer 415 having one or more conductive foil regions formed thereon.

Figure 10:
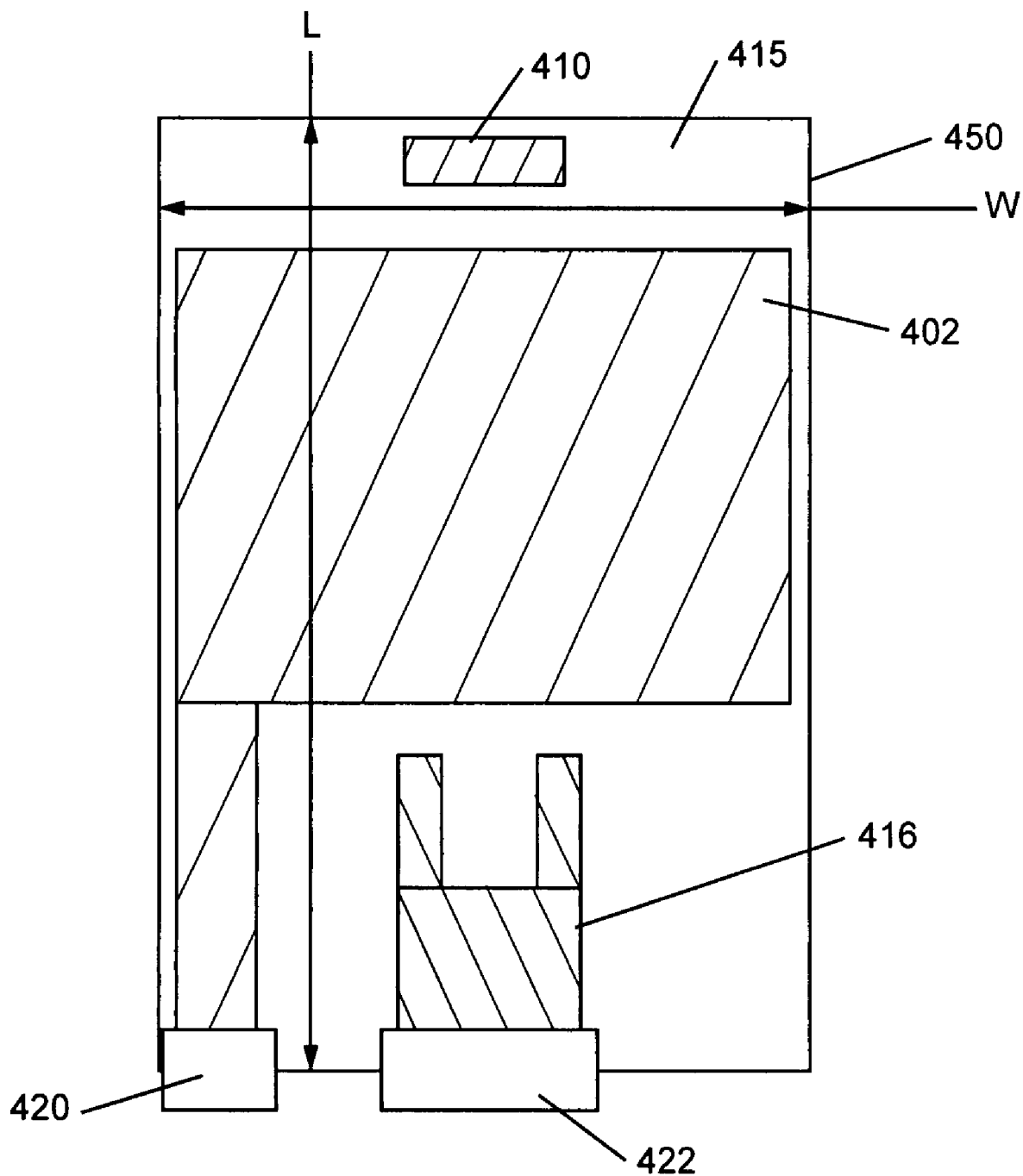
FIG. 10 illustrates a top view of the flexible interconnect assembly comprising conductive foil elements supported by a flexible dielectric film according to the present invention.

Referring to FIGS. 9 and 10, the flexible electrical interconnecting element 450 is sized to overlay the top surface of the electrical device 412 and to further overlay regions of the substrate module 214. Accordingly, the electrical interconnecting element 450 has a rectangular shape with a transverse width W that is wide enough to cover the conductive substrate module surfaces A1 and A2 and a longitudinal length L that is long enough to cover the conductive device surfaces A and B as well as the substrate conductive surface B1. In addition, the flexible electrical interconnecting element 450 may include one or more electrical connectors 420, 422, or the like, attached to or formed integral with the dielectric layer 415 and electrically interfaced with the first conductive element 402 and the second conductive element 416 for electrically interconnecting the device 412 to other off substrate devices.

The flexible electrical interconnecting element 450 includes a plurality conductive foil elements 402, 410, 416 sized and positioned to make electrical contact with desired device and substrate module conductive pads A, B, A1, A2 and B1. Each foil element 402, 410, 416 comprises a substantially flexible layer of conductive material, e.g. copper having a thickness of about 0.05 mm (0.002 inch) formed in a pattern suitably configured to make the desired electrical interconnections and to carry a desired current load with low thermal stresses and low electrical parasitics. In particular, the first conductive foil element 402 is positioned and patterned to overlay each of the substrate conductive surfaces A1 and A2 and to be bonded thereto at a plurality of bond areas 408 by the bonding techniques described above. Additionally, the first conductive foil element 402 overlays each of the device conductive surfaces A and is bonded thereto at a plurality of bond areas 408. Accordingly, the first conductive foil element 402 provides a conductive path between each of the discrete device conductive surfaces A for more evenly distributing surface charges and thermal energy over the device top surface. In addition, the conductive foil element 402 provides a conductive path between the device 412 and the substrate conductive surfaces A1 and A2 with reduced electrical interconnecting parasitics.

The second foil element 416 is positioned and patterned to overlay each of the device conductive surfaces B and to electrically interconnect the substrate conductive surface B1 with bond areas 408 positioned as required to make the electrical interconnections.

The second conductive foil element 410 is positioned and patterned to overlay each of the substrate conductive surfaces B and to electrically interconnect the two discrete device conductive surfaces B using bond areas 408 for more evenly distributing surface charges and thermal energy over the device top surface.

The dielectric film 415 may be made of flexible sheet of material, such as, polyimide, polyester or any other suitable substrate with thicknesses of approximately 0.05 mm, (0.002 inches). Moreover, the flexible electrical interconnecting element 450 may be fabricated from commonly used flexible circuit substrates that have a dielectric film formed with metallization on one or both sides thereof and by removing the metallization from the dielectric film in desired areas while leaving patterns of metallization in place that are suitably patterned to provide for proper interconnection structures and bonding areas as described above. Typically the metallization comprises copper as the primary conductor, however other metals, such as, aluminum, nickel, and gold can be used as the metal layer to enable bonding to device surfaces or substrate surfaces using a variety of methods, e.g., compression bonding and/or soldering.

The flexible electrical interconnecting element 450 is formed compliant enough to bend or flex in order to be placed into contact with conductive surfaces positioned in different planes such as on the top surface of the electronic device on the substrate module surface that is substantially coincident with the bottom surface of the electronic device. Accordingly, the length and width dimensions of the flexible electronic interconnecting element 450 are formed slightly larger than the length and width need to be spanned in order to make electrical connections to provide enough material for forming bend radii where the interconnecting element 450 is flexed to contact surfaces in different planes. Alternately, the flexible electrical interconnecting element 450 can be formed into various 3-dimensional shapes using mechanical forming and thermoforming methods as may be required to make desired electrical interconnections. However, even when the flexible electrical interconnecting element 450 is formed into a 3-dimensional shape the device maintains enough flexibly for further flexing at the time of assembly with an electronic device and support substrate.

It will also be recognized by those skilled in the art that, while the invention has been described above in terms of preferred embodiments, it is not limited thereto. Various features and aspects of the above described invention may be used individually or jointly. Further, although the invention has been described in the context of its implementation in a particular environment, and for particular applications, e.g. for interconnecting power IC's with a substrate module, those skilled in the art will recognize that its usefulness is not limited thereto and that the present invention can be beneficially utilized in any number of environments and implementations where it is desirable to interconnect a high powered or fast switching circuit with a substrate module with reduced inductive and resistive parasitics and with improved reliability. Accordingly, the claims set forth below should be construed in view of the full breadth and spirit of the invention as disclosed herein.

What is claimed is:

1. An electrical assembly comprising: an electrical device including at least one first conductive device surface; a substrate module configured to support the electrical device and including at least one first conductive substrate surface non-planar with the first conductive device surface; and a first conductive foil element extending from the first conductive substrate surface upwards and then over to the first conductive device surface, wherein the electrical device includes at least one second conductive device surface and the substrate module includes at least one second conductive substrate surface, wherein the first conductive foil element includes at least one raised ridge configured to extend up and over the second conductive substrate surface such that the first conductive foil element avoids electrical contact with the second conductive substrate surface, and wherein a space between the ridge and the second conductive substrate surface ridge is filled with an electrically insulating material.

2. The electrical assembly of claim 1 in which the foil element further extends over from the first conductive device surface then downwards to another first conductive substrate surface.

3. The electrical assembly of claim 1 further including a second conductive foil element extending from the second conductive substrate surface upwards and then over to the second conductive device surface.

4. The electrical assembly of claim 1 in which the first conductive device surface includes a length and the first conductive foil element extends over a predetermined portion of the length to maximize an electrical contact area between the first conductive foil element and the first conductive device surface.

5. The electrical assembly of claim 4 in which the first conductive foil element extends over at least about 80% of the length of the first conductive device surface.

6. The electrical assembly of claim 5 in which the electrical contact area between the first conductive foil element and the first conductive device surface is at least 50% of a total surface area of the first conductive device surface.

7. The electrical assembly of claim 4 in which the first conductive substrate surface includes a length and the first conductive foil element extends over a predetermined portion of the length to maximize an electrical contact area between the first conductive foil element and the first conductive substrate surface.

8. The electrical assembly of claim 7 in which the first conductive foil element extends over at least about 80% of the length of the first conductive substrate surface.

9. The electrical assembly of claim 8 in which the electrical contact area between the first conductive foil element and the first conductive substrate surface is at least 50% of a total surface area of the first conductive substrate surface.

10. The electrical assembly of claim 1 further including a third conductive foil element configured to connect a plurality of second conductive device surfaces to each other.

* * * * *